(12) United States Patent
Au et al.

(10) Patent No.: US 6,360,754 B2
(45) Date of Patent: Mar. 26, 2002

(54) METHOD OF PROTECTING QUARTZ HARDWARE FROM ETCHING DURING PLASMA-ENHANCED CLEANING OF A SEMICONDUCTOR PROCESSING CHAMBER

(75) Inventors: Wing-kei Au, San Antonio; Ramiro Solis, Bandera, both of TX (US)

(73) Assignee: VLSI Technology, Inc., San Jose, CA (US)

( * ) Notice: Subject to any disclaimer, the term of this patent is extended or adjusted under 35 U.S.C. 154(b) by 0 days.

(21) Appl. No.: 09/042,605

(22) Filed: Mar. 16, 1998

(51) Int. Cl.$^7$ .............. B44C 1/22; C23F 1/12; H01L 21/3065; H01L 21/461
(52) U.S. Cl. .............. 134/1.1; 134/1.2; 134/2; 216/67; 438/714; 438/725; 438/905
(58) Field of Search .............. 134/1.1, 1.2, 2; 216/67; 438/714, 725, 905

(56) References Cited

U.S. PATENT DOCUMENTS

| | | | |
|---|---|---|---|
| 4,786,352 A | * 11/1988 | Benzing | 156/345 |
| 5,486,235 A | 1/1996 | Ye et al. | 134/1.1 |
| 5,647,953 A | 7/1997 | Williams et al. | 156/643.1 |
| 5,685,916 A | 11/1997 | Ye et al. | 134/1.1 |
| 5,693,147 A | * 12/1997 | Ward et al. | 134/1.1 |
| 5,785,877 A | * 7/1998 | Sato et al. | 216/67 |
| 5,814,155 A | * 9/1998 | Solis et al. | 134/1 |

\* cited by examiner

*Primary Examiner*—Zeinab El-Arini
(74) *Attorney, Agent, or Firm*—Wagner Murabito & Hao LLP

(57) ABSTRACT

The present invention is a method of suppressing etchrate of quartz hardware in semiconductor processing chamber during plasma-enhanced cleaning. In one embodiment, the method of the present invention includes the steps of: (a) introducing a mixture of fluorocarbon gas, oxygen, and water vapor into the chamber; and (b) activating the mixture to form a quartz-safe plasma cleaning gas. According to the present invention, the presence of water vapor substantially suppresses etching of quartz hardware. Etchrate of the polymer contaminants, however, is substantially unaffected. In one embodiment of the invention, the fluorocarbon gas includes $CF_4$, and, water vapor is introduced at a rate of at least 60 standard cubic centimeters per minute (SCCM).

7 Claims, 2 Drawing Sheets

METHOD OF PROTECTING QUARTZ HARDWARE FROM ETCHING DURING PLASMA-ENHANCED CLEANING OF A SEMICONDUCTOR PROCESSING CHAMBER

FIELD OF THE INVENTION

The present invention relates to a method of cleaning a semiconductor processing chamber. More particularly, the present invention relates to a method of protecting quartz hardware from being etched during plasma-enhanced cleaning of a semiconductor processing chamber.

BACKGROUND OF THE INVENTION

During most semiconductor manufacturing processes, such as dielectric etching or chemical vapor deposition, unwanted materials are sometimes formed on the semiconductor wafers themselves and on the interior walls of the processing chamber. Naturally, it is critical to remove these unwanted materials from the semiconductor wafers. Equally importantly, materials deposited on the interior walls of the processing chamber must also be removed because they may become a source of contaminants. For instance, in dielectric etching, long-chain carbon polymers may build up on the interior walls of the processing chamber. Loose particles of these polymers may break off during the manufacturing process and contaminate the wafers. Thus, in order to increase yield and provide a contaminant-free environment, processing chambers must be periodically cleaned.

Conventionally, processing chambers are cleaned by manual scrubbing. In this conventional method, the manufacturing process has to be halted and the processing chamber opened such that the interior walls may be scrubbed. Consequently, this method is extremely time-consuming and disruptive to the manufacturing process. In addition, the chamber cleaner has to rely on visual inspection to determine whether a processing chamber is clean or not. Sometimes, when manual scrubbing is not thorough enough, the yield of semiconductors subsequently processed will be greatly affected.

Other methods have been proposed to overcome problems with the conventional manual scrubbing method. One such method, which is applicable to removing oxide and dielectric contaminant build-up, involves the use of a plasma-enhanced etching process to "dry clean" the semiconductor processing chamber walls. In that prior art method, fluorine-based gases such as $CF_4$ and $CHF_3$ and oxygen are highly energized to form a plasma which reacts with the contaminants to form $CO_2$, $SiF_2$ and other gaseous compounds which are then vacuumed away through the processing chamber's exhaust system. Although this prior art method is an improvement over the conventional manual scrubbing method, it is unsuitable for cleaning processing chambers which include quartz hardware. In particular, fluorine plasma formed by fluorine-based gases such as $CF_4$ and $CHF_3$ is very aggressive to quartz. Consequently, the exposed quartz parts of those processing chambers have to be replaced regularly, unnecessarily increasing the semiconductor manufacturing cost.

More importantly, when exposed to fluorine plasma, the quartz hardware of those processing chambers would be etched. As a result, the quartz hardware may become a source of particle contaminants. Such particle contaminants may introduce impurities in the wafers being processed. Thus, yield may be adversely affected.

Therefore, what is needed is a method of providing an ultra-clean environment for a semiconductor processing chamber having quartz hardware. What is further needed is a novel plasma cleaning gas which is particularly applicable to remove polymer and photoresistive contaminant build-up and is quartz-safe.

SUMMARY OF THE DISCLOSURE

The present invention is a method of suppressing the etchrate of quartz hardware in a semiconductor processing chamber during plasma-enhanced cleaning. In one embodiment, the method of the present invention comprises the steps of: (a) introducing a mixture of fluorocarbon gas, oxygen, and water vapor into the chamber; and (b) activating the mixture to form a quartz-safe plasma cleaning gas. The plasma cleaning gas then reacts with contaminants deposited on the walls of the semiconductor processing chamber to form gaseous exhaust compounds. The etchrate of the quartz hardware, however, is substantially suppressed by the presence of water in the plasma cleaning gas.

In the present embodiment of the invention, the fluorocarbon gas comprises $CF_4$. In addition, the present invention may be practiced in a plasma etcher where the oxygen/fluorocarbon ratio is 10:1, and having a pressure of 1.2 Torr, a temperature of 200° C. and an electrode power of approximately 1000 watts. Further, in the present embodiment, water vapor is introduced at a rate of more than 60 standard cubic centimeters per minute (SCCM).

BRIEF DESCRIPTION OF THE DRAWINGS

The accompanying drawings, which are incorporated in and form a part of this specification, illustrate embodiments of the invention and, together with the description, serve to explain the principles of the invention.

DETAILED DESCRIPTION OF THE PREFERRED EMBODIMENTS

Reference will now be made in detail to the preferred embodiments of the invention. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be recognized by one skilled in the art that the present invention may be practiced without these specific details. In other instances, well known methods, procedures, components, and circuits have not been described in detail as to avoid unnecessarily obscuring aspects of the present invention.

Figure 1:
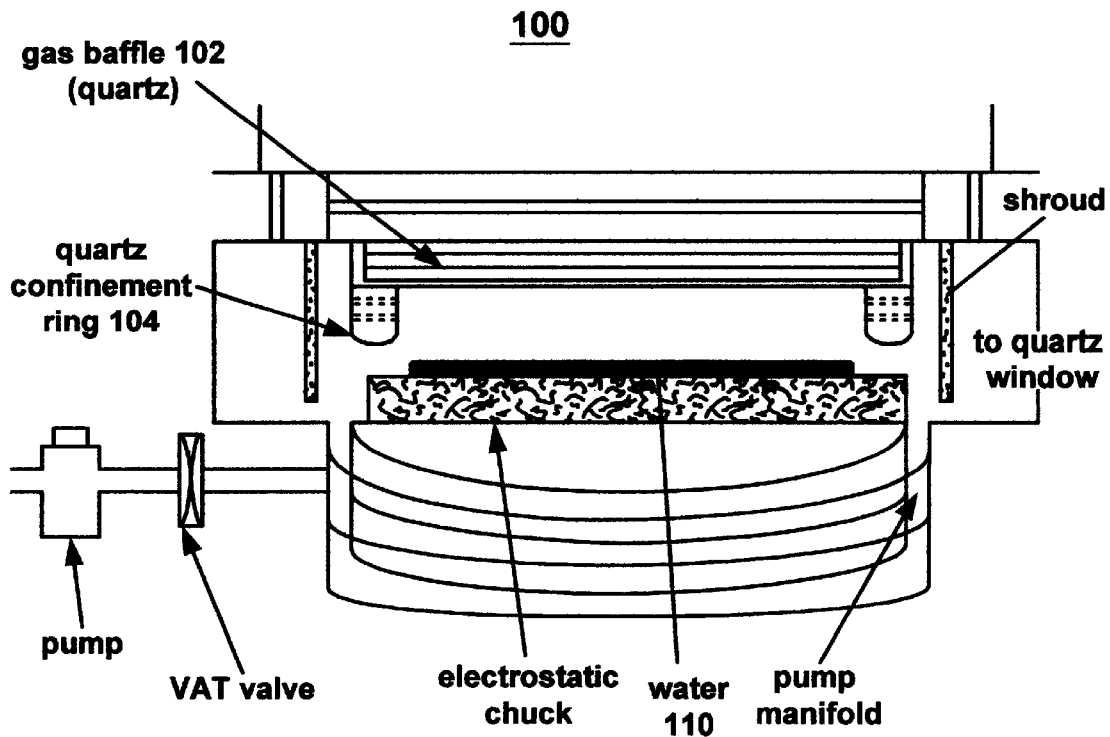
FIG. 1 is a schematic of a plasma etcher in which the present invention may be practiced.

FIG. 1 shows a schematic of an exemplary plasma etcher 100 where the method according to the present invention may be practiced. As illustrated, plasma etcher 100 includes quartz hardware such as gas baffle 102, quartz confinement ring 104, and quartz window (not shown). The present invention is particularly useful in cleaning polymer or photoresistive contaminants deposited on semiconductor processing chambers such as plasma etcher 100. However, a person of ordinary skill in the art, upon reading the present disclosure, would understand that the present invention is equally applicable to clean other types of processing chambers. Also illustrated in FIG. 1 is a wafer 110 being plasma etched by plasma etcher 100. Preferably, the method of the present invention is carried out in between production runs. That is, during the chamber cleaning process of the present invention, wafer 110 is preferably removed from plasma etcher 100.

According to one embodiment of the present invention, a mixture of fluorocarbon gas, oxygen, and water vapor is first introduced into plasma etcher 100. The mixture is then energized by RF electrodes (not shown) to form a highly energetic plasma. The method and apparatus for generating a plasma is well known in the art, and is therefore not discussed here so as to avoid obscuring aspects of the present invention. In one embodiment, the fluorocarbon gas may comprise $CF_4$. In other embodiments, fluorine-containing compounds such as $NF_3$ may also be used.

The plasma or plasma cleaning gas according to the present invention, which is formed by energizing the mixture of fluorocarbon gas, oxygen, and water vapor, has a high etchrate against polymer or photoresistive contaminant build-up. The plasma of the present invention reacts with these polymer or photoresistive contaminants to form gaseous compounds such as $CO_2$, which may be removed via an exhaust system (not shown). Significantly, the plasma cleaning gas of the present invention is not aggressive towards quartz. In particular, according to the present invention, the etchrate of quartz and other dielectric materials is substantially suppressed by the presence of water in the plasma cleaning gas.

Figure 2:
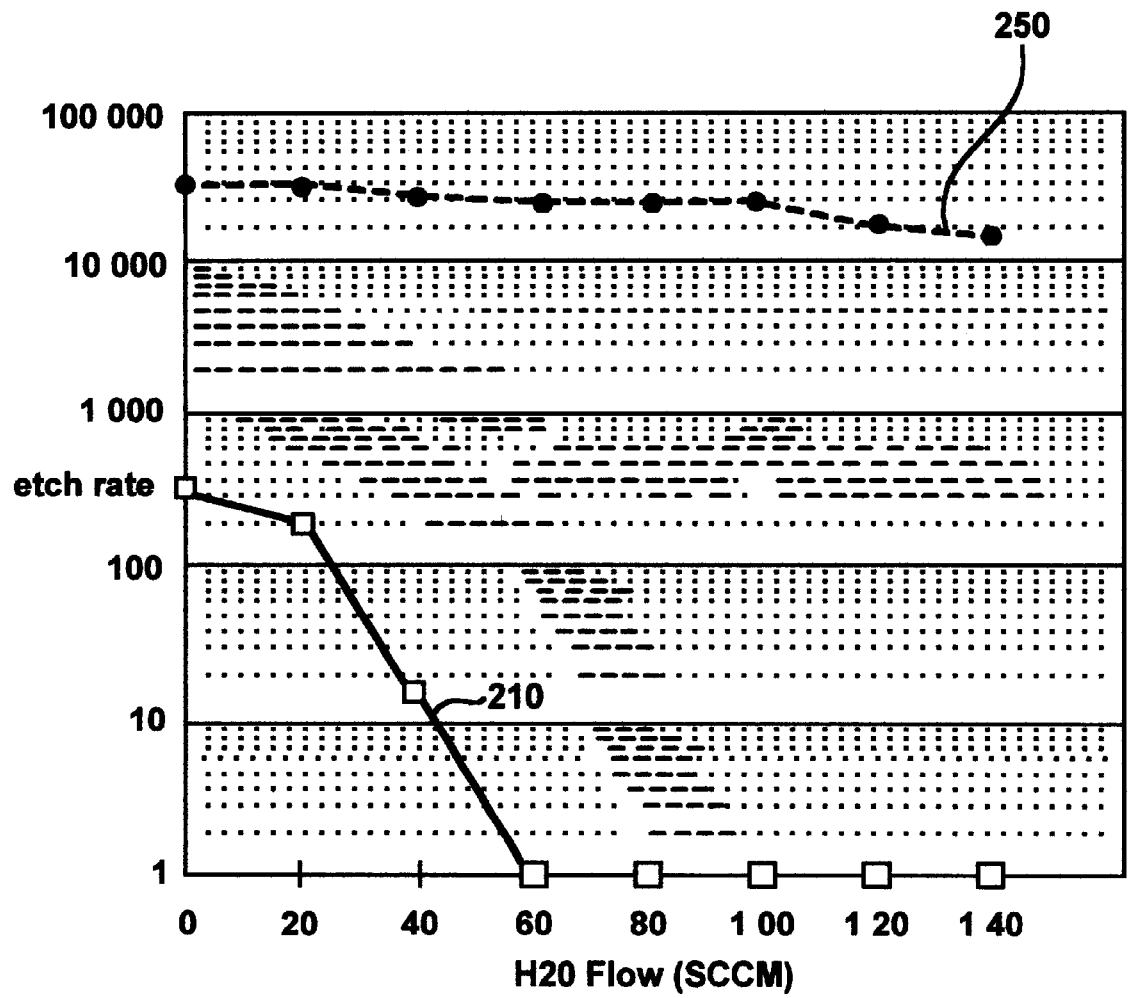
FIG. 2 shows a graph illustrating etchrates of polymer contaminant and quartz by the plasma cleaning gas of the present invention.

FIG. 2 is a plot of data collected from experiments conducted with a $CF_4/H_2O$ plasma according to the present invention. These experiments were carried out under a pressure of 1.2 Torr and at temperature of 200° C. with an electrode power of 1000 W; and these experiments were carried out in a semiconductor processing chamber similar to plasma etcher 100. Other conventional test equipment involved in these experiments are well known to persons of ordinary skill in the art, and are therefore not described herein. Specifically, curve 210 is a plot of the quartz etchrate as a function of $H_2O$ flowrate. As shown in FIG. 2, the etchrate of quartz decreases as water vapor is introduced into the processing chamber. Notably, when the $H_2O$ flowrate is approximately 60 SCCM, the etchrate of quartz is nearly zero. Accordingly, in one embodiment of the present invention, water vapor is introduced into plasma etcher 100 at a rate higher than 60 SCCM. At the flowrate of 60 SCCM, the ratio of O2:CF4:H20 is approximately 10:1:3.

FIG. 2 also includes curve 250 in dotted lines depicting the etchrate of long chain carbon polymers with respect to $H_2O$ flowrate. Unlike curve 210, curve 250 remains substantially constant as $H_2O$ flowrate increases. Thus, by applying fluorocarbon/water plasma, long-chain carbon polymers generated during the etching of dielectric will be efficiently removed. Significantly, the quartz hardware of the processing chambers will be preserved, as the fluorocarbon/water plasma is not corrosive to quartz.

A method of and a composition for quartz-safe plasma cleaning of a semiconductor processing chamber has thus been disclosed. The present invention is particularly useful for removing polymer or photoresistive contaminant build-up on the interior walls of a semiconductor processing chamber having many quartz parts. Because the quartz parts are not etched during the cleaning process, production wafers are exposed to a lesser degree of particle contamination. As a result, production yield is increased. In addition, as degradation of quartz hardware is suppressed by the present invention, life spans of semiconductor processing chambers are also increased.

What is claimed is:

1. A method of plasma cleaning interior surfaces of a semiconductor processing chamber having quartz hardware between production runs during which a semiconductor wafer does not reside within said semiconductor processing chamber, si method comprising the steps of:
    a) introducing a mixture including fluorocarbon gas, oxygen and water vapor into said semiconductor processing chamber, wherein said fluorocarbon gas comprises $CF_4$ and wherein a ratio of $O_2/CF_4/H_2O$ is approximately 10:1:3;
    b) activating said mixture to form a plasma cleaning gas inert to quartz; and
    c) removing contaminants deposited on interior surfaces of said semiconductor processing chamber by using said plasma cleaning gas between said production runs, wherein corrosion of quartz hardware of said semiconductor processing chamber by said plasma cleaning gas is substantially suppressed by presence of said water vapor.

2. The method according to claim 1 wherein said contaminants include long-chain carbon polymers.

3. A method of protecting quartz hardware inside a semiconductor processing chamber during plasma-enhanced cleaning of said semiconductor processing chamber between production runs during which a semiconductor wafer does not reside within said semiconductor processing chamber, said method comprising the steps of:
    a) forming a plasma cleaning gas, said plasma cleaning gas comprising a fluorocarbon gas, oxygen and water vapor, wherein said fluorocarbon gas comprises $CF_4$ and wherein a ratio of $O_2/CF_4/H_2O$ is approximately 10:1:3;
    b) exposing interior surfaces of said semiconductor processing chamber to said plasma cleaning gas between said production runs; and
    c) removing contaminants deposited on said interior surfaces by using said plasma cleaning gas wherein an etchrate of said quartz hardware is substantially suppressed by presence of said water vapor.

4. The method according to claim 3 further comprising the step of:
    d) vacuuming exhaust gas form said semiconductor processing chamber.

5. The method according to claim 3 wherein said contaminants include long chain carbon polymers.

6. A plasma cleaning gas for removing contaminants deposited on interior walls of a semiconductor processing chamber between production runs during which a semiconductor wafer does not reside within said semiconductor processing chamber, said plasma cleaning gas comprising:
    oxygen;
    carbon tetrafluoride ($CF_4$); and
    water vapor,
    wherein an etchrate of quartz hardware of said semiconductor processing chamber between said production runs is substantially suppressed by presence of said water vapor and wherein a ratio of oxygen to carbon tetrafluoride to water vapor is approximately 10:1:3.

7. The plasma cleaning gas according to claim 6 wherein an etchrate of said contaminants is substantially unaffected by presence of said water vapor.

* * * * *